(12) United States Patent
Akram et al.

(10) Patent No.: US 6,426,642 B1
(45) Date of Patent: Jul. 30, 2002

(54) INSERT FOR SEATING A MICROELECTRONIC DEVICE HAVING A PROTRUSION AND A PLURALITY OF RAISED-CONTACTS

(75) Inventors: Salman Akram; David R. Hembree, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/250,994

(22) Filed: Feb. 16, 1999

(51) Int. Cl.[7] .......................... G01R 31/26; H01L 23/04
(52) U.S. Cl. ........................ 324/765; 257/730
(58) Field of Search ................... 324/754–765, 324/158.1; 439/68–72; 438/106–108; 257/730, 737, 738, 777, 778; 361/820

(56) References Cited

U.S. PATENT DOCUMENTS

| | | | |
|---|---|---|---|
| 5,291,062 A | * 3/1994 | Higgins, III | 257/698 |
| 5,478,779 A | 12/1995 | Akram | 437/189 |
| 5,572,405 A | * 11/1996 | Wilson et al. | 361/705 |
| 5,592,736 A | 1/1997 | Akram et al. | 29/842 |
| 5,642,265 A | * 6/1997 | Bond et al. | 361/809 |
| 5,686,318 A | 11/1997 | Farnworth et al. | 437/8 |
| 5,808,360 A | 9/1998 | Akram | 257/738 |
| 5,810,609 A | 9/1998 | Faraci et al. | 439/71 |
| 5,814,894 A | 9/1998 | Igarashi et al. | 257/787 |
| 5,831,441 A | 11/1998 | Motooka et al. | 324/754 |
| 5,838,161 A | 11/1998 | Akram et al. | 324/755 |
| 5,880,590 A | 3/1999 | Desai | 324/757 |
| 6,027,346 A | 2/2000 | Sinsheimer | 439/66 |
| 6,062,873 A | 5/2000 | Kato | 439/71 |
| 6,107,109 A | * 8/2000 | Akram et al. | 438/15 |
| 6,114,240 A | 9/2000 | Akram | 438/667 |
| 6,121,576 A | * 9/2000 | Hembree et al. | 219/209 |
| 6,140,827 A | * 10/2000 | Wark | 324/758 |
| 6,169,021 B1 | 1/2001 | Akram | 438/612 |
| 6,248,429 B1 | * 6/2001 | Akram et al. | 428/210 |
| 6,307,394 B1 | 10/2001 | Farnworth | 324/765 |
| 6,313,529 B1 | * 11/2001 | Yoshihara et al. | 257/724 |

* cited by examiner

Primary Examiner—Michael Sherry
Assistant Examiner—Russell M. Kobert
(74) Attorney, Agent, or Firm—Howrey Simon Arnold & White, LLP

(57) ABSTRACT

An insert is provided for testing a chip-scale-packaged microelectronic device having an encapsulant-protrusion and a ballgrid-array of outwardly-projecting contacts. The insert comprises a substrate of mono-crystalline silicon. Walls of the substrate define a plurality of pockets that are configured to receive and contact the outwardly-projecting contacts of the microelectronic device. Additional walls of the substrate define a recess disposed amongst the plurality of pockets. The recess has a width greater than the widths of any of the pockets. Additionally, the recess comprises a perimeter greater than that of the encapsulant-protrusion of the chip-scale-packaged microelectronic device, and a depth operative to clear the encapsulant-protrusion when the chip-scale package is seated upon the insert.

24 Claims, 13 Drawing Sheets

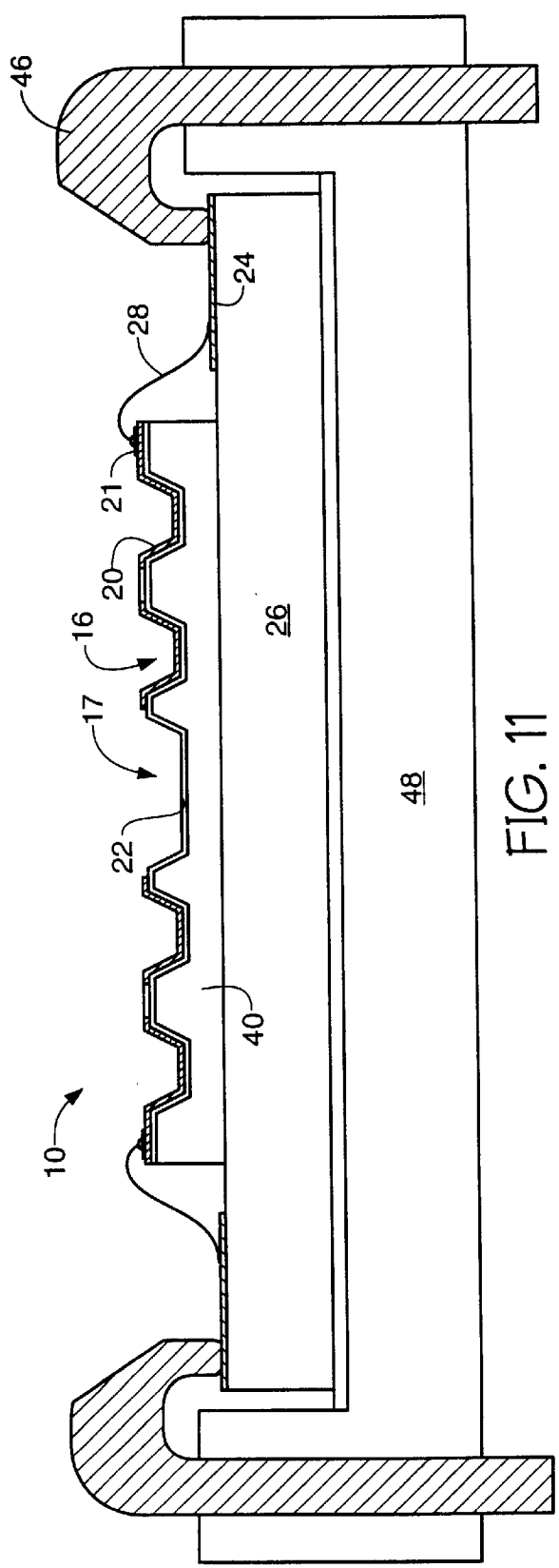
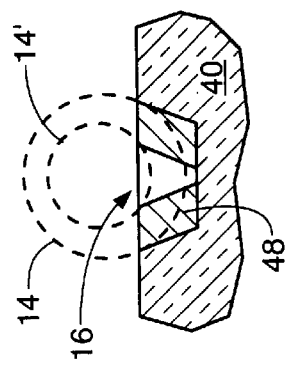
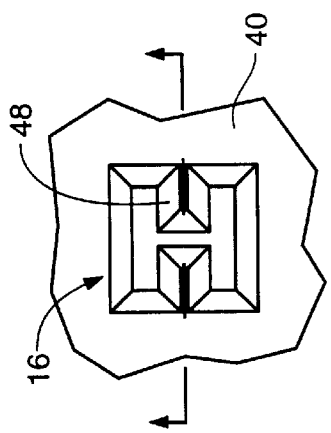
FIG. 11
FIG. 12
FIG. 13

US 6,426,642 B1

INSERT FOR SEATING A MICROELECTRONIC DEVICE HAVING A PROTRUSION AND A PLURALITY OF RAISED-CONTACTS

BACKGROUND OF THE INVENTION

The present invention relates to a test insert and method for testing a microelectronic device. More particularly, the present invention provides a silicon insert for testing a chip-scale-packaged electronic device having an encapsulant-protrusion and plurality of outwardly-projecting-contacts of a ball-grid-array.

A well known package of the microelectronics industry for semiconductor die comprises a molded epoxy package having a plurality of conductive pins that electrically interface the semiconductor die. More recently, however, the industry has developed smaller packages and interface solutions that use solder balls arranged in an array disposed on a surface of an electronic device. The array of solder balls, known as a ball-grid-array or bump-grid-array (BGA), permit smaller distances between adjacent input/output lines and provide for greater input/output density and lower costs for these devices.

One exemplary, prior art, package is the flip-chip, which comprises, with reference to FIG. 1, a plurality of outwardly-projecting electrical contacts 14 placed directly upon a face 18 of a semiconductor die 12. The flip-chip 9 does not require bond wires between bond pads of the die and a lead frame of the more conventional pin-type packages (not shown). The solder balls or outwardly-projecting-contacts 14 of the flip-chip are preferably of the same size, for example, in the range of 0.3 to 0.4 millimeters in diameter, and placed in an array having a distance between adjacent balls of, for example, about 1.5 mm. The advent of such BGA flip-chips led to the development of BGA test sockets.

Further referencing FIGS. 1–2, an exemplary prior art, BGA test socket 10 comprises a substrate 11 having a plurality of pockets 16 arranged in an array corresponding to the outwardly-projecting-contacts 14 of a flip-chip 9. A layer of conductive material 20 is formed and patterned over the substrate so as to provide conductive liners in pockets 16 and conductive traces over the substrate in electrical communication with the pockets. Such prior art, BGA test socket 10 is able to temporarily seat a flip-chip, microelectronic device and electrically engage the outwardly-projecting contacts of its BGA interface. During testing of the flip-chip packaged microelectronic device, the test socket and the flip-chip are biased together with pockets 16 of the test socket engaged with the outwardly-projecting-contacts 14 of the flip-chip.

Recent trends of the semiconductor industry have led to development of smaller size semiconductor die. At the same time, the number of input/output lines required for the die have remained the same or have increased, thereby increasing their input/output densities. To accommodate these input/output density enhancements, the semiconductor manufacturers have developed alternative chip-scale packages.

One such alternative chip-scale-package is known as a "globbed" chip-scale-package. With reference to FIGS. 3A,3B,3C, "globbed" chip-scale-package 38 comprises a semiconductor die 12 mounted to an insulating support 32, also known as an interposer, which has an area about 1–2 times larger than die 12. Conductive lines 35 of interposer 32 electrically couple and re-route the small-size, fine-pitch, interposer pads 34 associated with die 12 to larger size, standard pitch, BGA contacts 14. The outwardly projecting contacts 14 of the interposer are designed in accordance, and for compliance, with conventional BGA standards.

Further referencing FIG. 3A, encapsulant protrusion 36 of globbed chip-scale-package 38, is disposed between and amongst a plurality of the outwardly protruding contacts 14 of the chipscale-package. Encapsulant protrusion 36 comprises a material, e.g., non-conductive epoxy, suitable for enclosing interposer opening 31. Encapsulant protrusion 36 protects and encases bond-wires 30 which bond-wires bond-out and electrically couple terminals 29 of die 12 to conductive pads 34 of interposer 32. Encapsulant protrusion 36 of globbed chip-scale-package 38, with reference to FIG. 3C, usually has a height $h_2$ beyond the face of interposer 32 less than the height hi of the outwardly projecting contacts 14.

Prior art, BGA test inserts, for example the insert as shown in FIG. 1, may not provide reliable testing of the globbed chip-scale-packaged, microelectronic devices. When using such prior art, test insert to test globbed chip-scale-packaged, microelectronic devices, a region of upper surface 19 of the test insert may contact the encapsulant protrusion 36 of the globbed chip-scale-packaged microelectronic device, so as to interfere and prevent engagement of its outwardly projecting-contacts 14 with respective pockets 16 of the test insert 10.

What is needed is a BGA test socket for a globbed chip-scale-packaged, microelectronic device, which socket overcomes some of the problems of the prior art. What is also needed is a test insert capable of providing full and reliable, temporary electrical engagement with such microelectronic device. What is also needed is a method of reliably testing a globbed chip-scale-packaged, microelectronic device.

SUMMARY OF THE INVENTION

The present invention relates to the formation of an insert for engaging a microelectronic device having outwardly projecting contact bumps. The insert may be known by such terms as a receptacle, a BGA socket, an interconnect, a BGA test receiver, or silicon insert. The present invention recognizes and overcomes problems of the prior art caused by an encapsulant projection of a globbed chip-scale-packaged microelectronic device interfering with the interconnection of the insert with the outwardly projecting contacts of the chip-scale-packaged microelectronic device.

In accordance with one embodiment of the present invention, an insert is formed for seating and testing a chip-scale-packaged microelectronic device having a plurality of outwardly projecting contacts and a protrusion. The substrate is formed with walls that define a plurality of pockets configured to seat and engage the outwardly projecting contacts of the chip-scale-package. Other walls of the substrate define a recess configured to receive with clearance the encapsulant protrusion of the chip-scale-package when the outwardly projecting contacts are seated in the plurality of pockets.

In accordance with one aspect of this exemplary embodiment, the recess has a perimeter encompassing an area greater that that of a plurality of the pockets.

In accordance with another aspect of the exemplary embodiment, the recess of the insert is formed simultaneously with the pockets and of equal depth.

In accordance with another exemplary embodiment of the present invention, an insert comprises a substrate having walls that define a plurality of pockets that are configured to receive the outwardly projecting contacts of a microelectronic device. Other walls of the substrate may define vias that pass through the substrate and are in communication with associated pockets of the plurality. Conductive material fills the vias and lines a pocket connected to the via.

These and other features of the present invention will become more fully apparent in the following description and independent claims, or may be learned by the practice of the invention as set forth hereinafter.

BRIEF DESCRIPTION OF THE DRAWINGS

The present invention will be understood from reading the following description of the particular embodiments with reference to specific embodiments illustrated in the intended drawings. Understanding that these drawings depict only particular embodiments of the invention and are not therefore to be considered limiting of its scope, the invention will be and explained with additional detail through use of the accompanying drawings in which:

FIG. 11 is a cross-sectional view of the semiconductor structure after further processing, showing conformal insulating and metal layers patterned overportions of the substrate including the pockets, and additionally showing the insert assembled within a test jig;

FIG. 12 is a partial planar elevation view showing a pocket of an insert;

FIG. 13 is a partial cross-sectional view illustrating a pocket of an insert engaging various size solder balls;

DETAILED DESCRIPTION OF THE PREFERRED EMBODIMENTS

Reference will now be made to drawings wherein like structures are provided like reference designations. The drawings are representative, non-limiting diagrams of select embodiments of the present invention and are not necessarily drawn to scale.

The present invention relates to formation of an insert for receiving and testing a "globbed" chip-scale-packaged microelectronic device having an array of outwardly projecting contacts, e.g., of a ball-grid-array or bump-grid-array (BGA). Such insert may also be known by other terms such as, for example, interconnect, interposer, socket, BGA test socket, or silicon insert.

Figure 1:
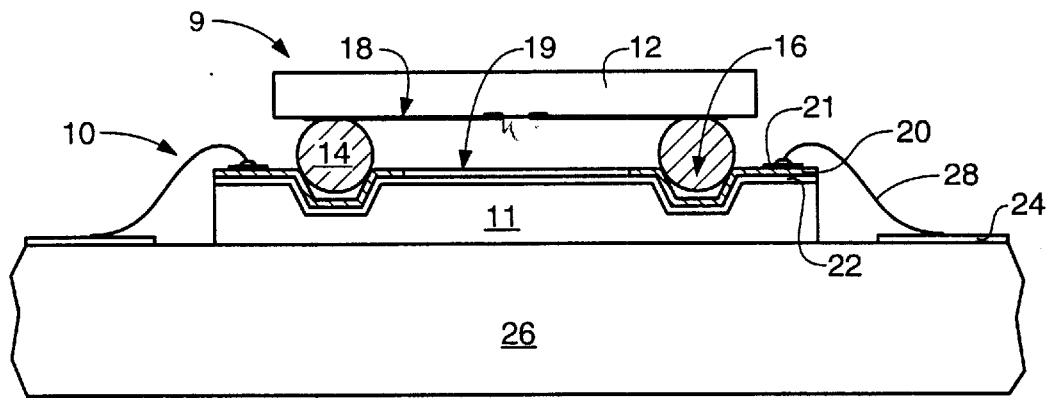
FIG. 1 is a cross-sectional view of a known insert engaging a known BGA flip-chip component.

FIG. 1 shows a cross-sectional view of a known flip-chip 9 seated upon a known insert 10. Solder balls or outwardly projecting contacts 14 of flip-chip 9 engage pockets 16 of insert 10. Inwardly facing surface 18 of flip-chip 12 is kept in spaced relationship over surface 19 of insert 10. Patterned conductive material 20 of the insert electrically couple pockets 16 to their associated pads 21 around the periphery of the insert 10. Typically, dielectric 22 insulates conductive material 20 from substrate 11. Bonds wire 28 electrically couple the peripheral pads 21 of insert 10 to conductive pads 24 of support substrate 26.

Figure 2:
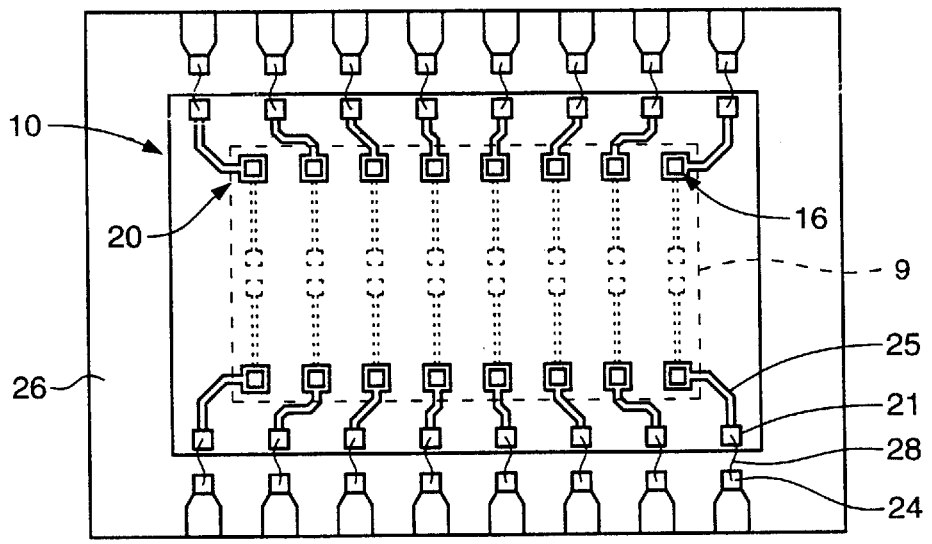
FIG. 2 is a planar elevational view of a known insert wire-bonded to an underlying support substrate, showing an array of pockets of the insert.

A planar elevational view, with reference to FIG. 2, shows pockets 16 of insert 10 arranged in an array, which would correspond to the BGA structure of a flip-chip (shown in phantom lines). Providing additional detail, conductive traces 25 of patterned conductive material 20 of insert 10, electrically couple pockets 16 to the pads 21 around the periphery of insert 10, while bond wires 28 bound-out pads 21 of the insert to the conductive pads 24 of support substrate 26.

Recent trends of the semiconductor industry have reduced semiconductor die size, while increasing the number of input/output interconnects. These changes have lead to development of newer ball-grid-array or bump-grid-array (i.e., BGA) interface solutions capable of accommodating the smaller die of increased I/O densities. One such exemplary, prior art, BGA interface package comprises the globbed chip-scale-package.

Figure 3A:
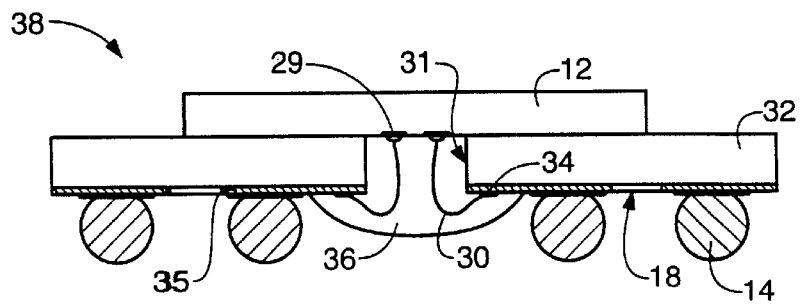
FIG. 3A is a cross-sectional view showing a known globbed chip-scale-packaged microelectronic device.

Referencing FIG. 3A, globbed chip-scale-packaged microelectronic device 38 comprises a semiconductor die 12 disposed over insulating support 32. Walls 31 of support 32 define an opening through which bond wires 30 bond-out contacts 29 of die 12 to pads 34 of support 32. Outwardly projecting contacts or solder balls 14 of support 32 are disposed across its outwardly facing surface 18, and arranged in an array or grid in compliance with BGA industry standards. Encapsulation material 36, such as epoxy, seals opening 31 for protecting bond wires 30 and die 12. Hereinafter, encapsulation material 36 is referred to as an "encapsulant projection". Although shown having a rounded upper surface, encapsulant projection 36 may comprise alternative shapes, such as, for example, a squared profile as might be provided by a mold.

In FIG. 3A, contacts 29 of semiconductor die 12 are located near a center region of the die. Alternatively, with reference to FIG. 3B, the contacts of die 12 might be located near a peripheral edge of the die. To accommodate this alternative embodiment, an alternative support 32 comprises a recess 13 that seats die 12 therein. Bond wires 30 electrically interface the peripheral pads of the die to pads 34 of the interposer 32 proximate recess 13. Conductive traces 35 of the support couple and re-route the central pads 34 to alternatively positioned outwardly projecting-contacts 14. With reference to FIG. 3C, the outwardly projecting contacts 14 of the chip-scale-package 38 have a height hi greater than the height $h_2$ of encapsulant projection 36. In an exemplary embodiment, outwardly projecting contacts 14 have a height he of about 0.35 millimeters (about 0.8 times its width or "diameter"), and encapsulant projection 36 a height $h_2$ of about 0.1 to 0.3 millimeters.

Figure 3B:
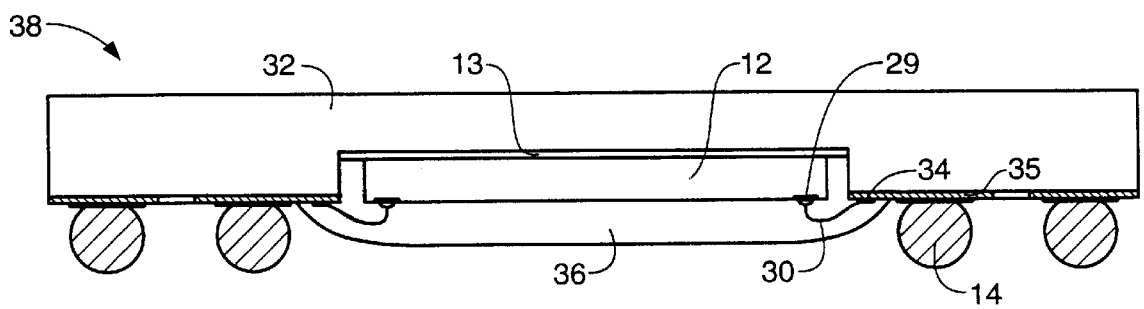
FIG. 3B is a cross-sectional view showing another globbed chip-scale-packaged microelectronic device of the prior art.
Figure 3C:
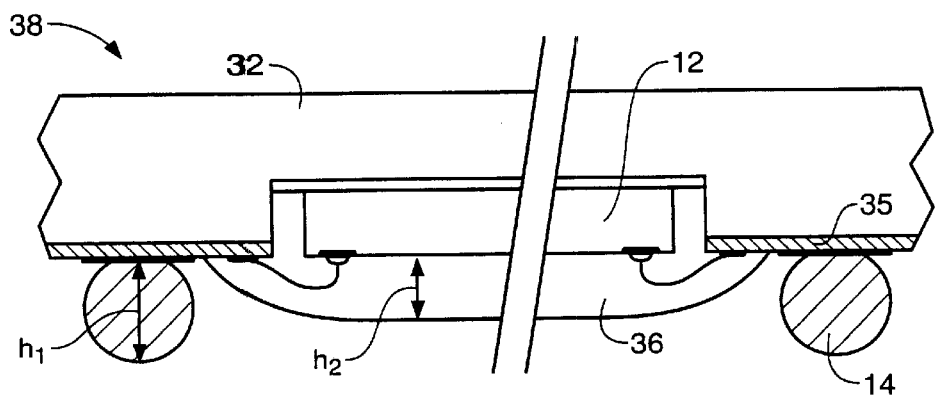
FIG. 3C is a partial cross-sectional view showing relative heights of an encapsulate protrusion and outwardly projecting contacts of a known, globbed chip-scale-packaged microelectronic device.

Continuing with reference to FIGS. 3A–3C, when trying to seat such globbed chip-scale-packaged microelectronic device 38 over prior art BGA test inserts—i.e., an insert similar to that of FIG. 1—the encapsulant projection 36 of the package may confront a region of the upper surface of the insert as to interfere with and prevent the outwardly projecting contacts 14 of the device from engaging respective pockets 16 of the prior art insert.

Figure 4:
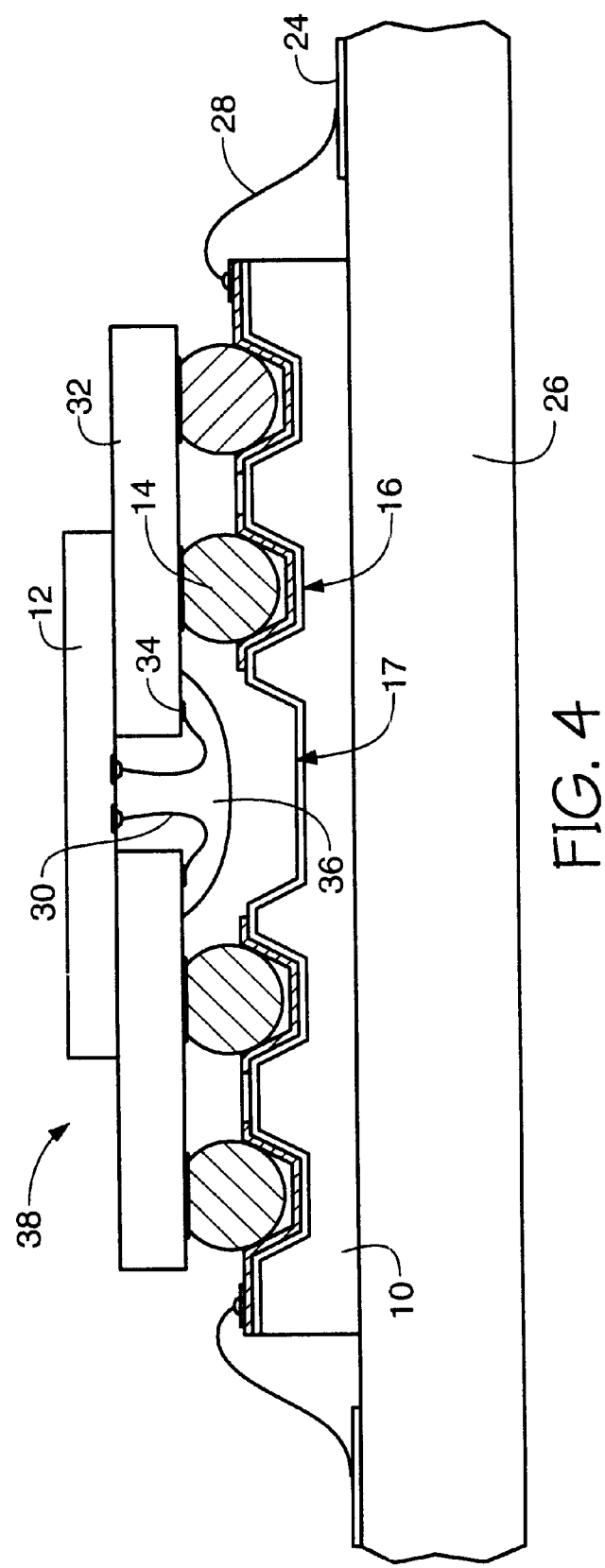
FIG. 4 is a cross-sectional view showing a globbed chip-scale-packaged microelectronic device seated upon an insert in accordance with an exemplary embodiment of the present invention.

Recognizing this potential difficulty, the present invention proposes a new test insert having a recess configured to receive with clearance a protrusion of such chip-scale-package. In an exemplary embodiment of the present invention, with reference to FIG. 4, insert 10 comprises recess 17 having a peripheral outline and depth capable of receiving with clearance an encapsulant projection of a globbed chip-scale-packaged microelectronic device while the outwardly projecting contacts of the device are seated in pockets 16 of the insert. In a further exemplary embodiment, insert 10 forms part of a test jig for testing such globbed chip-scale-packaged devices. Wire bonds or flex-tab-tape electrically couple insert 10 to support substrate 26 which, in turn, is in electrical communication with an external test system (not shown in FIG. 4). A method of forming such insert, in accordance with another exemplary embodiment of the present invention, is now described below with reference to FIGS. 5–13.

Figure 5:
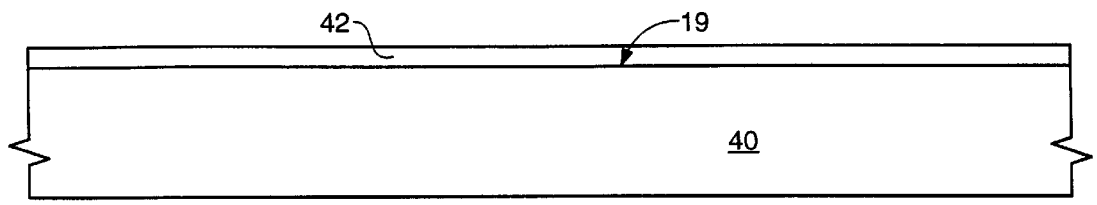
FIG. 5 is a cross-sectional view showing a substrate and dielectric layer during formation of an insert in accordance with an embodiment of the present invention.

Referencing FIG. 5, substrate 40 comprises a semiconductor substrate, a dielectric substrate, or a layered combination thereof. Suitable exemplary substrates include silicon-on-glass, silicon-on-sapphire, germanium, gallium arsenide, or ceramic. In the current application, the term "substrate" will be understood to mean any supporting structure including, but not limited to, semiconductor substrates. Further, the term "substrate" or "semiconductor substrate" may also refer to any construction comprising semiconductor material, including but not limited to bulk semiconductive materials such as a semiconductor wafer (either alone or in assemblies comprising other materials thereon), and semiconductive material layers (either alone or in assemblies comprising other materials).

In a preferred exemplary embodiment, further referencing FIG. 5, substrate 40 comprises mono-crystalline silicon having a <100> crystalline lattice-plane at surface 19 and a thickness of at least 500 μm, and more preferably a thickness between 650 to 750 μm. Etch resistant material 42 such as silicon nitride is formed over surface 19 of substrate 40. Etch resistant material 42 is provided a thickness greater than 100 angstroms, and more preferably between 500 to 3000 angstroms, and is formed using known means such as chemical vapor deposition (CVD) or physical vapor deposition (PVD).

Figure 6:
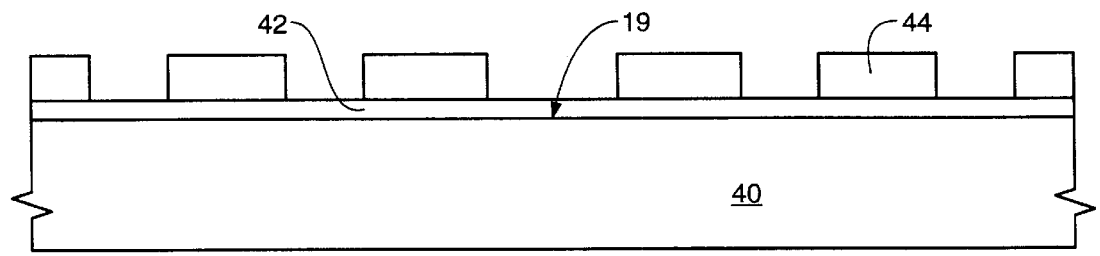
FIG. 6 is a cross-sectional view of the structure of FIG. 5 after further processing, showing patterned photoresist.
Figure 7:
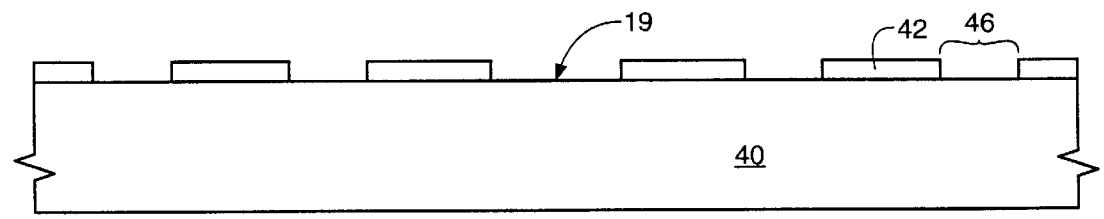
FIG. 7 is a cross-sectional view of the substrate and dielectric layer of FIG. 6 after further processing, showing a mask over the substrate.
Figure 8:
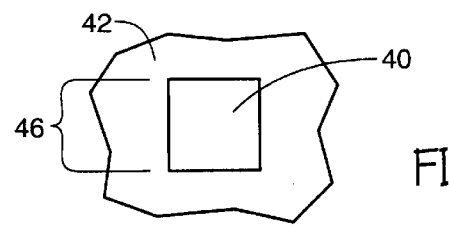
FIG. 8 is a partial planar elevational view of the substrate of FIG. 7, showing an opening in a mask that exposes a region of the underlying substrate.

Moving on to FIG. 6, photoresist 44 is patterned over etch resistant material 42 using known photolithographic procedures to provide openings that expose corresponding regions of etch resistant material 42. Through these openings of the patterned photoresist 44, the exposed regions of the etch resistant material 42 are removed and openings 46 formed in the layer of etch resistant material (hereinafter mask 42) as shown in FIGS. 7–8.

Figure 9:
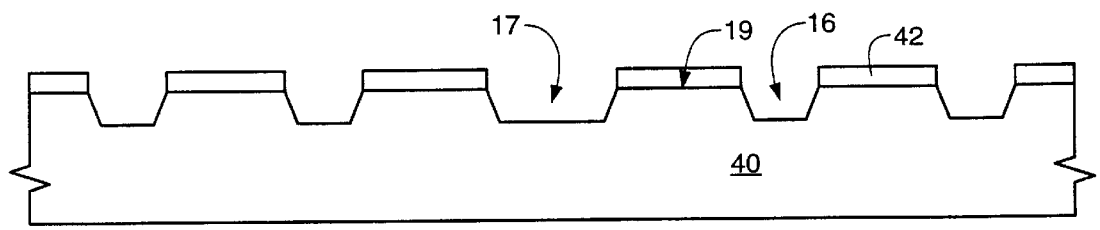
FIG. 9 is a cross-sectional view of the substrate of FIG. 7 after further processing, showing pockets and a recess.

Referencing FIG. 9, exposed regions of substrate 40 are then etched through the mask openings 46 to form pockets 16 and recess 17 within the substrate. In a preferred exemplary embodiment, where substrate 40 comprises mono-crystalline silicon having a <100> lattice-plane of orientation at surface 19, a potassium hydroxide (KOH) etch solution is used to anisotropically etch the substrate. Using such anisotropic etchant, pockets 16 and recess 17 are formed with sidewalls having a slope of between 40° to 70° and typically 54° relative a plane defined by the substrate's surface 19.

Figure 10:
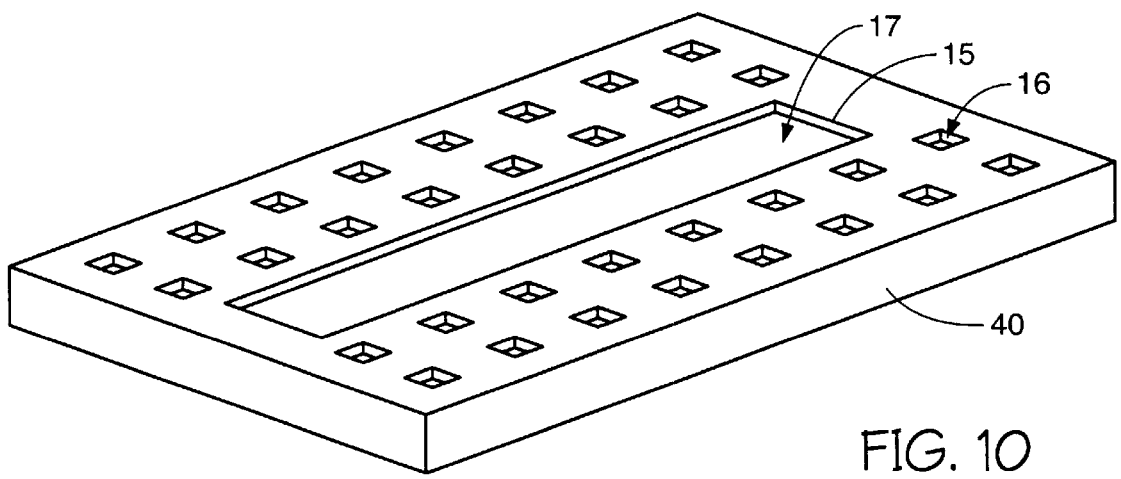
FIG. 10 is a prospective view of the substrate of FIG. 9 after further processing has removed a mask.

Continuing with reference to FIGS. 9 and 10, recess 17 and pockets 16 are preferably etched simultaneously with a depth of at least 10 μm, and more preferably between 15 to 150 μm. Additionally, the sidewalls that define recess 17 meet surface 19 of the substrate to define a peripheral outline 15 encompassing an area greater that that of any individual pocket 16, and more preferrably, greater that that of a plurality of the pockets. For example, pockets 16 are formed with a width between 100 to 400 μm, and more preferably between 200 to 350 μm, while recess 17 provided a width of at least 500μm and more preferably between 2,000 to 3,000

μm, and a length preferably between 4,000 to 15,000 μm. In a preferred exemplary embodiment, pockets 16 have widths slightly less than the diameter of the outwardly projecting contacts of the microelectronic to be seated therein.

After etching the pockets 16 and recess 17, mask 42 is removed and a dielectric 22—for example, an oxide, nitride, carbide or the like—formed conformably over substrate 40, see FIG. 11. Dielectric 22 is formed by a known deposition process such as, for example, chemical vapor deposition (CVD).

Preferably, dielectric 22 comprises silicon dioxide formed by thermal oxidation of underlying a silicon substrate 40. In such an exemplary embodiment, substrate 40 comprises silicon and is exposed to an oxidizing atmosphere comprising steam and oxygen at an elevated temperature (e.g. 950°). The oxidizing atmosphere oxidizes exposed portions of substrate 40 and forms an oxide layer conformally over the substrate's exposed surfaces. In an alternative embodiment, dielectric 22 is formed by thermal decomposition of tetraethylortho-silicate (TEOS). Preferably, the dielectric (hereinafter, insulating layer 22) is formed with a thickness of between 0.5 to 5 μm.

Conductive layer 20 is formed over the insulating layer 22 and in each of pockets 16. The conductive layer is patterned to provide conductive liners in pockets 16. The pockets (with conductive liners) are configured to engage the outwardly projecting contacts of a chip-scale-packaged microelectronic device for enabling electrical communication with the microelectronic device when seated thereon. In a preferred exemplary embodiment, regions of the originally deposited conductive layer 20 associated with recess 17 are removed. Alternatively, regions of the conductive material within recess 17 can be patterned to provide conductive traces within the recess.

Conductive layer 20 may comprise material of group IIIB through VIIIB metals, such as (but not limited to) the refractory metals, e.g., aluminum, iridium, copper, titanium, tungsten, tantalum, molybdenum, or alloys thereof. Conductive layer 20 might alternatively comprise other electrically conductive material such as, for example, metal-nitride of titanium-nitride or a silicide such as titanium-silicide. In a preferred exemplary embodiment, conductive layer 20, at regions associated with pockets 16, comprises an upper layer of titanium over a lower layer of aluminum. The upper layer is selected to prevent permanent or chemical bonding of the pocket liners to the conductive material of the outwardly projecting contacts to be seated therein. These conductive materials may be formed using known metal deposition processes, e.g., sputter, CVD, or PVD deposition. Additionally, the conductive materials can be patterned using known photolithographic, masking and etch procedures.

In another exemplary embodiment, conductive layer 20, at regions associated with bond pads 21, comprises a stack of two different layers, e.g., a lower barrier layer and an upper bonding layer to which wire bonds may be attached, as set forth in U.S. Pat. No. 5,592,736, issued Jan. 14, 1997, entitled "Fabricating An Interconnect For Testing Unpackaged Semiconductor Dice Having Raised Bond Pads", which is hereby incorporated by reference. See also U.S. Pat. No. 6,248,429, issued Jun. 19, 2001, entitled "Metallized Recess In A Substrate", which is also incorporated herein by reference. In particular, the barrier and bonding layers are formulated to prevent oxidation of conductive materials associated with the interconnects, which oxidation might otherwise change the resistance of its contacts. The bonding layer is selected to facilitate wire bonding thereto. In a preferred exemplary embodiment, the barrier layer comprises a metal such as platinum, titanium, tungsten, or alloys thereof. As patterned, certain portions of conductive layer 20 define traces 23 while other portions define bond pad 21 in electrical communication with the conductive liners of pockets 16. Methods of forming the conductive material traces and liners can be found in U.S. Pat. No. 6,248,429, issued Jun. 19, 2001, entitled "Metallized Recess In A Substrate", again incorporated herein by reference. In other more specific exemplary embodiments, regions of the conductive layer 20 associated with the bond pads may comprise multiple layers of conductive material such as, for example, a four layer stack (not shown) comprising titanium, tungsten, titanium and aluminum respectively.

In an exemplary embodiment, further referencing FIG. 11, bond pads 21 of insert 10 comprise a metal, such as aluminum organ aluminum-titanium stack, deposited over select regions of conductive layer 20. In an alternative embodiment, the bonding pads are patterned from a portion of conductive layer 20. These bond pads 21 serve as electrical interface terminals for insert 10. Wire bonds, tab tape, or other suitable connection means are coupled to the bond pads of the insert and provide electrical communication to external circuitry.

In a preferred exemplary embodiment, with reference to FIGS. 12–13, pockets 16 of the insert include known blade structures 48. Blade structures 48 allow pockets 16 to engage both small solder balls 14' or large solder balls 14 (shown in phantom lines). Accommodating a variety of solder ball dimensions, these pockets with blade structures facilitate reliable engagement and electrical coupling to BGA packaged microelectronic devices. U.S. Pat. No. 5,592,736, again incorporated herein by reference, provides additional information regarding such blades 48, and, in particular, teaches blade configurations that penetrate the outwardly-projecting contacts of a microelectronic device to a predetermine depth less than the height of the outwardly projecting contacts, while, at the same time, minimizing surface damage and spreading of the outwardly projecting contacts.

Returning to FIG. 4, a globbed chip-scale-packaged microelectronic device 38 is seated upon insert 10. Recess 17 of the insert comprises a peripheral outline greater than that of the encapsulant projection, and a depth preferably equal to that of pockets 16. Accordingly, during test of the globbed chip-scale-packaged microelectronic device, recess 17 is able to receive the encapsulant projection of the microelectronic device without contact, so as not to interfere with the mechanical coupling and electrical connection of pockets 16 with the outwardly projecting contacts 14 of the microelectronic device.

Figure 14:
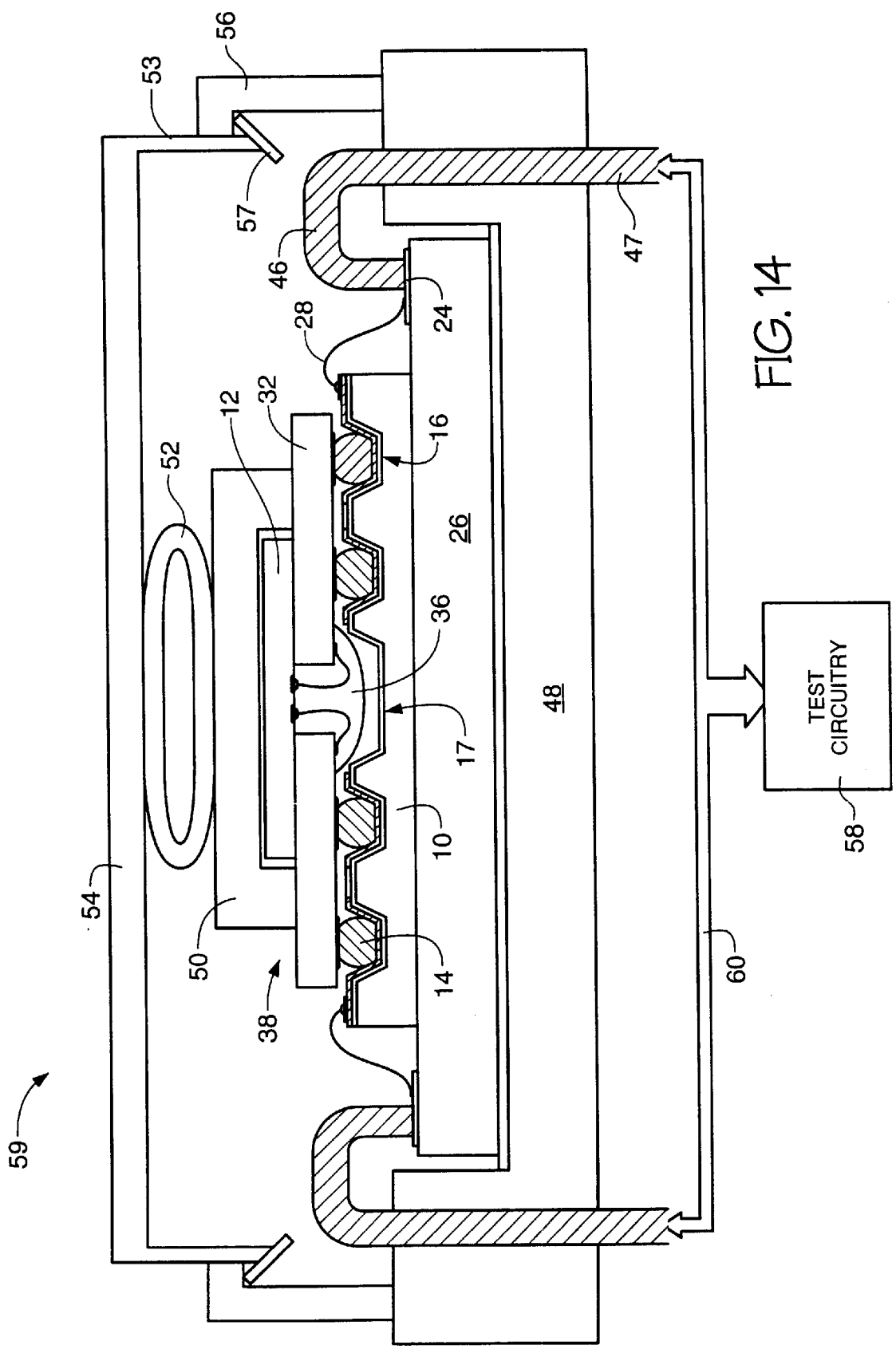
FIG. 14 is a cross-sectional view of a test jig showing a microelectronic device seated upon and pressed against a test insert in accordance with an embodiment of the present invention.

In accordance with another exemplary embodiment of the present invention, with reference to FIG. 14, a test jig 59 comprises an insert 10 within an assembly for testing a globbed chip-scale-packaged microelectronic device 38. Insert 10 is fixed to support substrate 26, which in-turn is fixed to a test head or base 48. Globbed chip-scale-packaged microelectronic device 38 is positioned over insert 10, with outwardly projecting contacts 14 seated and engaged with their respective pockets 16 of the insert. Encapsulant projection 36 of the microelectronic device extends into recess 17 of the insert without contacting walls that define the recess. Wire bonds 28 couple conductive pads of insert 10 to conductive pads of support substrate 26. Socket contacts 46 of the test jig electrically couple the circuit traces of the support substrate to terminal leads 47, which terminal leads are in electrical communication with test circuitry 58 by way of bus 60.

In the illustrated exemplary embodiment, cover 54 acts together with biasing member 52 and force plate 50 to apply a biasing force against the globbed chip-scale-packaged microelectronic device 38, thereby forcibly engaging its outwardly projecting contacts 14 against pockets 16 of insert 10. Cover 54 includes clips 53 and tabs 57. Tabs 57, at the ends of clips 53, are received and captured by clamp ring 56 for securing the cover 54 to base 48. Cover 54 preferably comprises resilient metal, such as steel. Force plate 50 preferably comprises a solid material such as metal, plastic or ceramic. The force plate 50 is shaped to engage and apply a force across various surfaces of the globbed chip-scale-packaged microelectronic device 38. Biasing member 52 is disposed between the inside surface of cover 54 and force plate 50 to apply a force against force plate 50 when cover 54 is secured to base 48. Biasing member 52 preferably comprises a resilient elastomeric material—e.g., silicone, butyl rubber, flouorsilicone, and polyimide—capable of exerting a biasing force over a continued life span. Additional aspects concerning elements of test jig 59 and its assembly are provided by U.S. Pat. application Ser. No. 09/,231,347, filed Jan. 13, 1999, entitled "Test Carrier With Variable Force Applying Mechanism For Testing Semiconductor Components", Now U.S. Pat. No. 6,307,394, and U.S. Pat. No. 5,796,264 entitled "Apparatus For Manufacturing Known Good Semiconductor Die", which application and patent are incorporated herein by reference.

Figure 15:
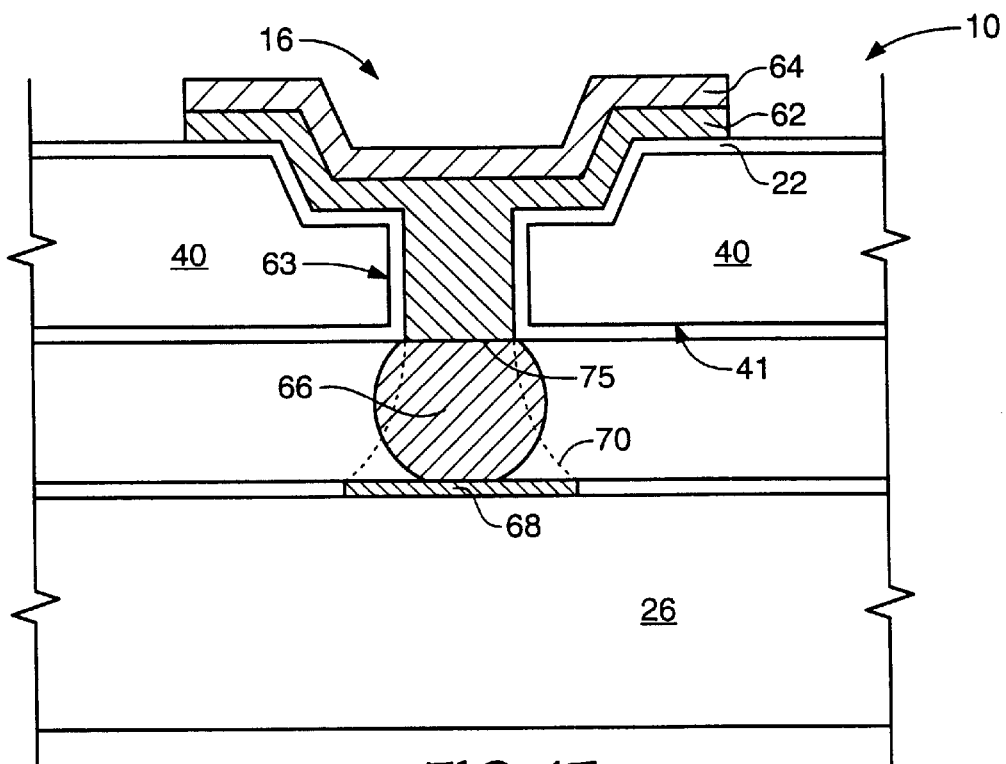
FIG. 15 is a partial cross-sectional view showing a pocket, via and micro-bump structure of a test insert over a support substrate in accordance with another embodiment of the present invention.

In accordance with another exemplary embodiment of the present invention, with reference to FIG. 15, a silicon insert 10 comprises a via filled with conductive material 62 connected to an underlying solder bump 66. Solder bump 66 is coupled to a surface 75 of the conductive material 62 within the via opening where walls 63 of the via meet surface 41 of substrate 40. The filled via provides electrical communication between pocket 16 and solder bump 66. Solder bump 66 of the insert is disposed over conductive pad 68 of support substrate 26. Conductive material 62 comprises metal we table by molten solder of solder bump 66. Likewise, conductive pad 68 of support substrate 26 also comprises metal we table by the reflow of such solder. Accordingly, a step of heating solder bump 66 will re-flow the solder of the solder bump and wet pad 68 for joining the insert to the supporting substrate. During such reflow, the surface tension and cohesive forces of the molten solder reshape the solder, e.g., as illustrated by phantom lines 70. This insert of FIG. 15 is capable of efficient manufacture by way of another exemplary embodiment of the present invention described below with reference to FIGS. 16–18.

Figure 16:
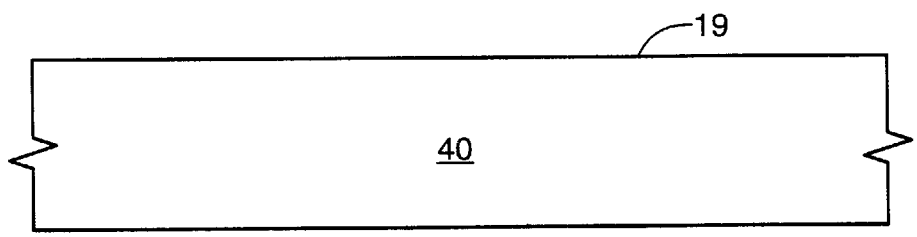
FIG. 16 is a partial cross-sectional view showing a substrate to be processed in accordance with a further embodiment of the present invention.
Figure 17:
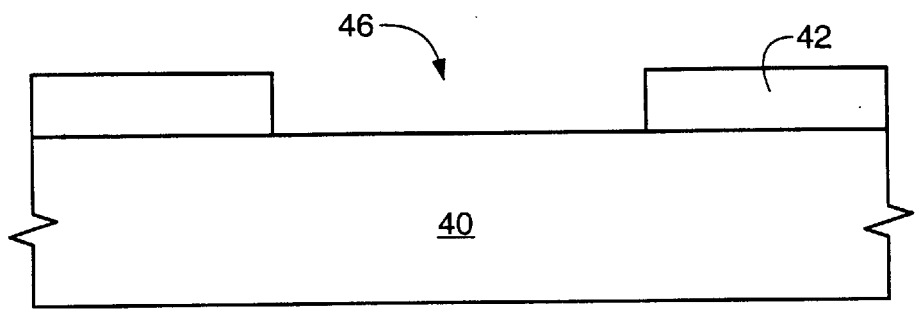
FIG. 17 is a schematic cross-sectional view of the structure of FIG. 16 after further processing, showing a mask over a substrate.
Figure 18:
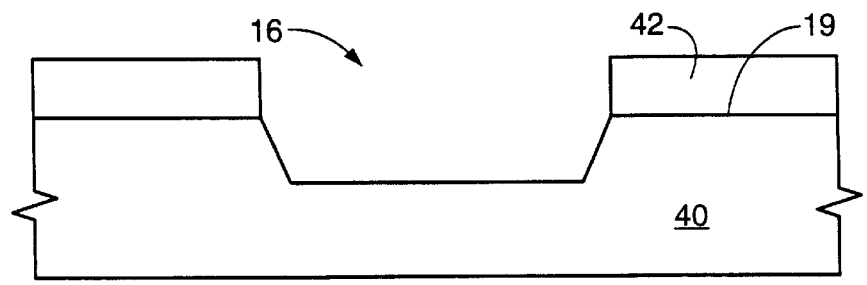
FIG. 18 is a representative cross-sectional view of the substrate of FIG. 17 after further processing, showing a pocket.

Referencing FIGS. 16–18, mask 42 is formed over. substrate 40 using a known method of mask formation. Substrate 40 preferably comprises monocrystalline silicon having a <100> lattice-plane of orientation at surface 19. Exposed portions of substrate 40 (i.e., exposed per openings 46 of mask 42) are etched to form pockets 16 in the substrate. In an exemplary embodiment, the substrate is etched using an anisotropic etchant—e.g., a mixture of potassium hydroxide (KOH) and water. With such anisotropic etchant, the <100> silicon lattice-surface of the substrate etches more rapidly than the other orientations so as to form sidewalls for the pockets having a slope of between 40 to 70 degrees, and typically 54 degrees, relative a plane defined by surface 19 of substrate 40.

As described before relative FIGS. 4–11, preferably, a recess (not shown in FIGS. 16–28) is formed in substrate 40 simultaneously with pockets 16. In such aspect, the pockets are configured to seat the outwardly projecting contacts of a BGA component, and the recess configured to receive with clearance a protrusion of a BGA component.

Figure 19:
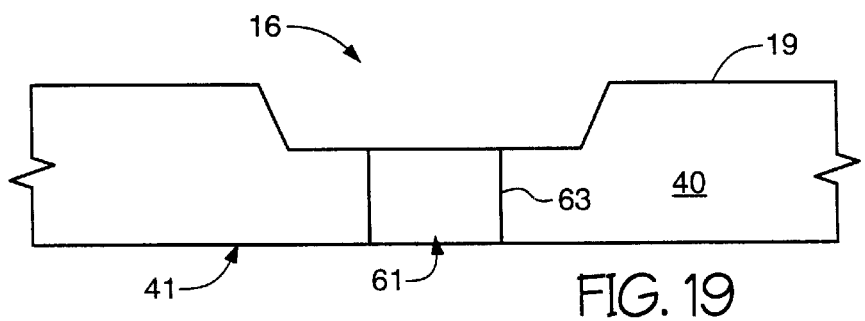
FIG. 19 is a cross-sectional view of the substrate of FIG. 18 after further processing, showing a via through the substrate and in communication with a pocket.

Continuing with the present embodiment with reference to FIG. 19, the substrate is further processed to form via 61 between a floor of pocket 16 and lower surface 41 of substrate 40. Via 61 comprises sidewalls 63 preferably centered about a center axis (not shown) of pocket 16. However, in alternative embodiments (not shown), via 61 is positioned away from the center-axis of pocket 16. In a preferred exemplary embodiment, via 61 is formed with sidewalls 63 substantially perpendicular (90°) to lower surface 41 of substrate 40, and with a diameter of about 30–150 $\mu$m.

In the exemplary embodiment, via 61 is formed using a laser machine. A suitable laser machine to form via 61 is a laser machine manufactured by General Scanning of Summerville, Mass., designated by Model No 670-W. In an exemplary embodiment, the laser power to form via 61 through a substrate of silicon (e.g., of 28 mil thickness) is a power of about 2–10 watts per opening, at a pulse duration of about 20–25 ns, and repetition rate of up to several thousand pulses per second. The spectrum for the laser beam can be standard infrared or green (e.g., 10.6 $\mu$m to 532 nm wavelength). Preferably, the laser beam is generated by a NdYag or $CO_2$ laser of about 10.6 $\mu$m wavelength.

Figure 20:
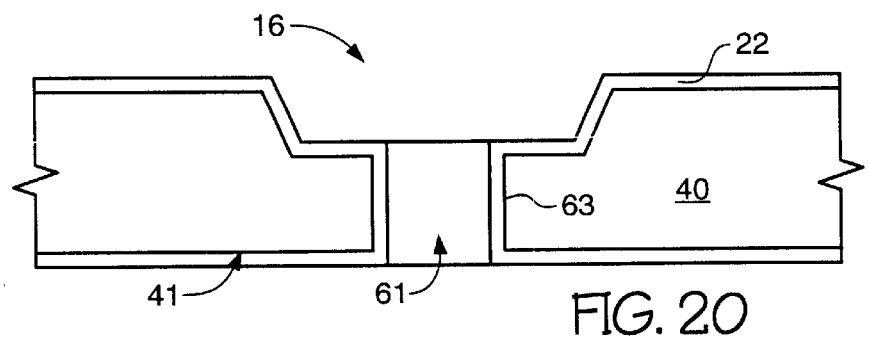
FIG. 20 is a cross-sectional view of the substrate of FIG. 19 after further processing, showing a conformal layer of insulating material over the substrate including the walls of the via and pockets.

After forming via 61 in communication with pocket 16, referencing FIG. 20, a dielectric 22 is layered conformably over substrate 40. In a particular embodiment, substrate 40 is exposed to an oxidizing environment to form an oxide dielectric 22 conformably over substrate 40, including the walls defining pocket 16 and via 61. The oxidizing atmosphere, in an exemplary embodiment, comprises steam and oxygen (02) at an elevated temperature of, for example, 950° C. Preferably, dielectric 22 is formed with a thickness in a range of 0.5 to 5 $\mu$m. In alternative embodiments, where substrate 40 comprises an electrically insulating material, such as ceramic or a glass filled resin, the formation of the dielectric insulating layer 22 may be eliminated.

Figure 21:
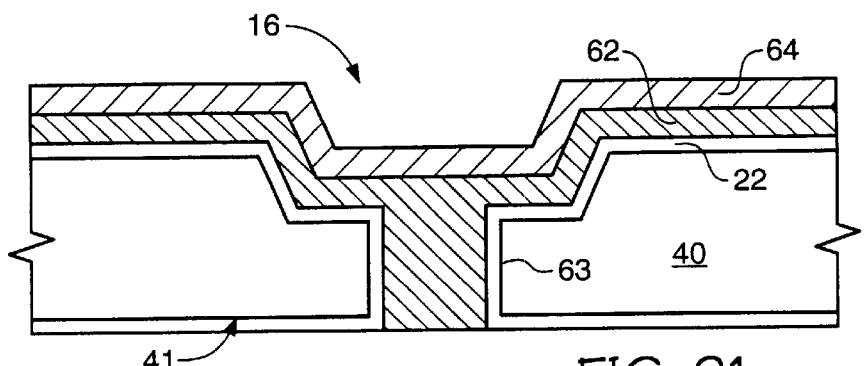
FIG. 21 is a cross-sectional view of the substrate of FIG. 20 after further processing, showing two layers of conductive material over the substrate.

Referring now to FIG. 21, a first conductive material 62 is formed conformably over substrate 40, including via 61 and the walls of pockets 16. In an exemplary embodiment, conductive material 62 fills via 61 and comprises metal wet able by solder. Preferably, conductive layer 62 comprises copper of at least 5 $\mu$m thickness, and more preferably, a thickness between 15–75 $\mu$m. Alternative metals for conductive material 62 include gold, palladium, nickel, chromium, or alloys thereof.

After forming conductive material 62, second conductive material 64 is formed over first conductive material 62, with a thickness greater than 500 angstroms and, more preferably, 600 to 20,000 angstroms. The second conductive material comprises material different from the first conductive material 62 and is selected to resist bonding to solder. In certain exemplary embodiments, second conductive material 64 comprises a metal such as tungsten, titanium, platinum, titanium nitride or titanium-tungsten. Conductive layers 62,64 are formed using known deposition processes, such as, for example, CVD, PVD, electrolytic or electrolysis deposition.

Figure 22:
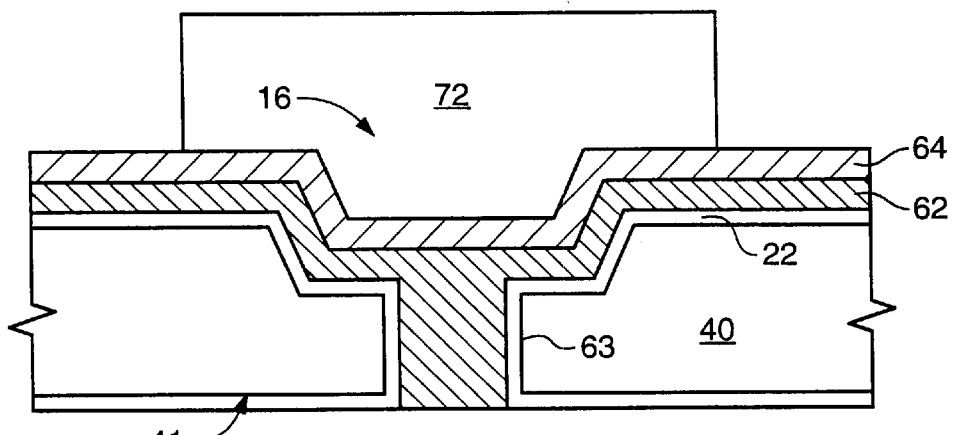
FIG. 22 is a cross-sectional view of the substrate of FIG. 21 after further processing, showing mask material over regions of the substrate associated with a pocket.
Figure 23:
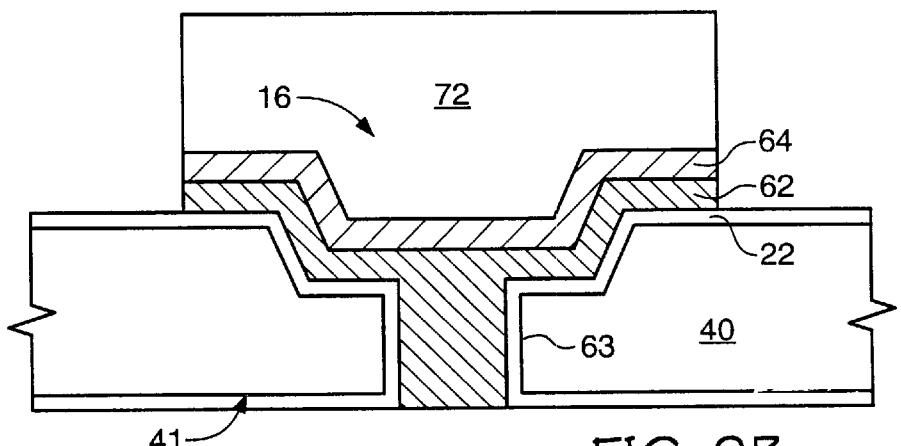
FIG. 23 is a cross-sectional view of the substrate of FIG. 22 after further processing, showing patterned conductive layers.
Figure 24:
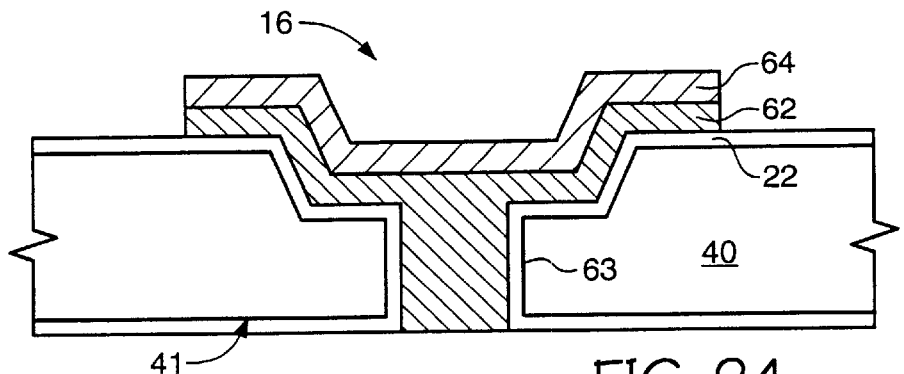
FIG. 24 is a cross-sectional view of the substrate of FIG. 23 after further processing, showing the via filled with conductive material and the pocket lined with the conductive material.

Continuing with reference to FIGS. 22–24, mask 72 is formed over the conductive layers and patterned appropriately to cover regions of the conductive materials associated with pockets 16. Mask 72 comprises known masking material, e.g., photoresist, nitride or other suitable mask material. With mask 72 over pockets 16, exposed regions of the conductive material are etched using known wet or dry etchants until exposing insulating layer 22 (or alternatively substrate 40). Next, mask 72 is removed, leaving pockets 16 lined with conductive material 62 and 64 as shown by FIG. 24

Moving on to FIGS. 25–28, a micro-bump 66 (referred to alternatively before relative to FIG. 15 as a solder bump) is formed over surface 41 of substrate 40 and in contact with exposed surface 75 of conductive material 62 in via 61. In a preferred exemplary embodiment, via 61 has a diameter of 30–150 µm. Additionally, micro-bump 66 comprises a metal alloy—e.g., a lead/tin (PbSn) solder or alloy of indiun/tin (InSn) or antimony/tin (SbSn)—that is formed on the outwardly facing surface 75 of the conductive material 62 at the via's opening.

In alternative exemplary embodiments, micro-bump 66 comprises metal of the group consisting of copper, nickel, gold and platinum, and is formed using known equipment and methods of the art, including for example selective deposition, electro-plating, electroless-plating, screen-printing or evaporation. U.S. Pat. No. 5,808,360, entitled "Micro Bump Interconnect For Bare Semiconductor Dice", issued Sep. 15, 1998, incorporated herein by reference, provides description of such exemplary micro-bump structures and formation. One such method of forming micro-bumps is now described below with reference to FIGS. 25–28.

Figure 25:
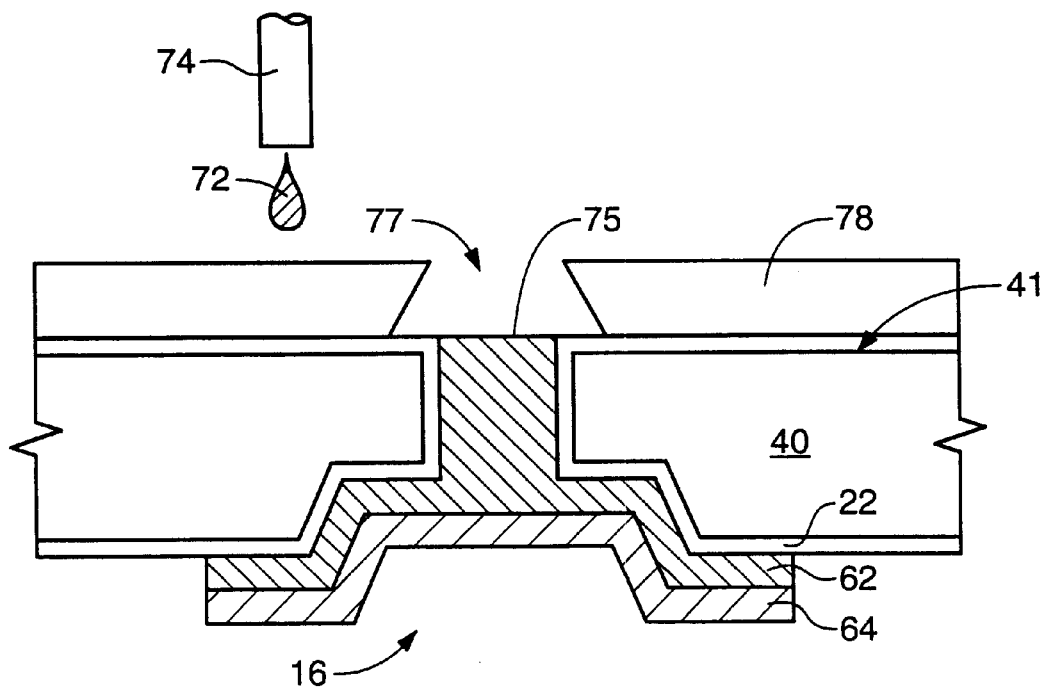
FIGS. 25–28 are schematic cross-sectional views illustrating a method of forming a solder bump over a via filled with conductive material in accordance with an exemplary embodiment of the present invention.
Figure 26:
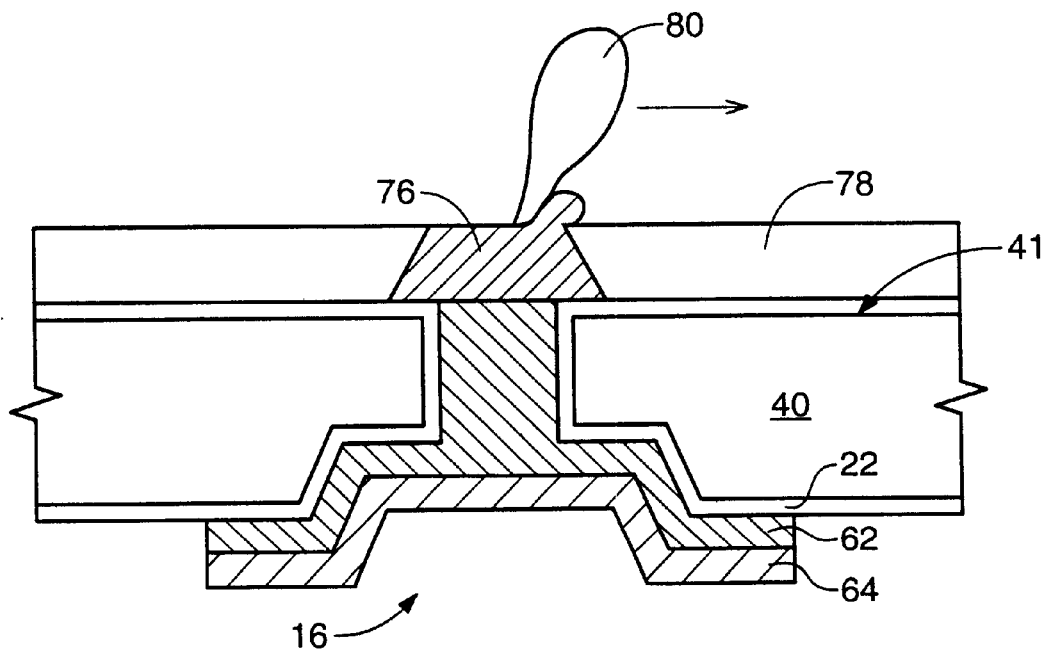

Referencing FIGS. 25–26, stencil 78 is positioned over surface 41 of substrate 40 and comprises opening 77 that is positioned over via contact 75. Via contact 75 is understood to mean, and was referred to before as, the outwardly facing surface 75 of the conductive material 62 within the via opening where walls 63 of via 61 meet surface 41 of substrate 40. Continuing with the present embodiment, a solder drop 72 is dispensed from a nozzle 74 over stencil 78 proximate the stencil's opening 77. Squeegee-blade 80 (FIG. 26) squeegees drop 72 across and into opening 77 of stencil 78. The height and width of opening 77 are selected in accordance with a desired solder volume for micro-bump 66. In an exemplary embodiment, opening 77 provides a pocket volume of about 0.032 mm³.

Figure 27:
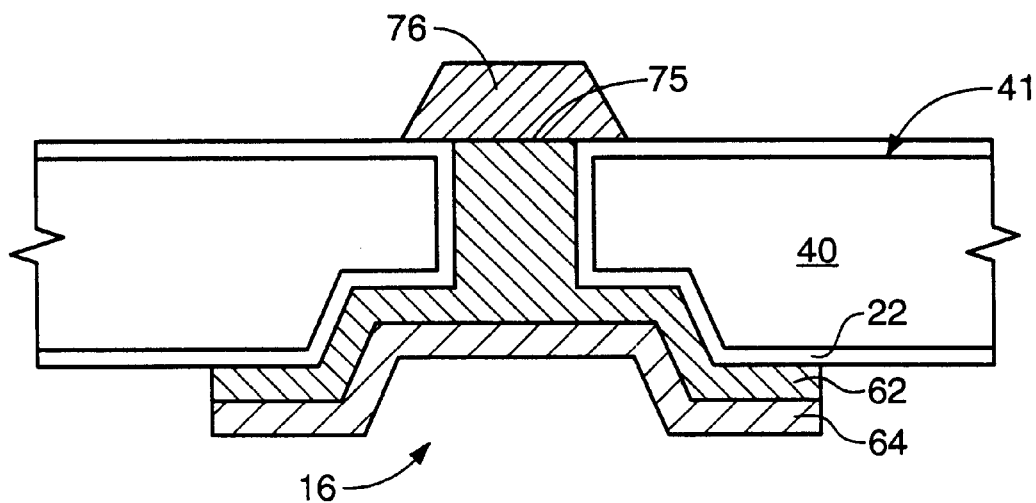
Figure 28:
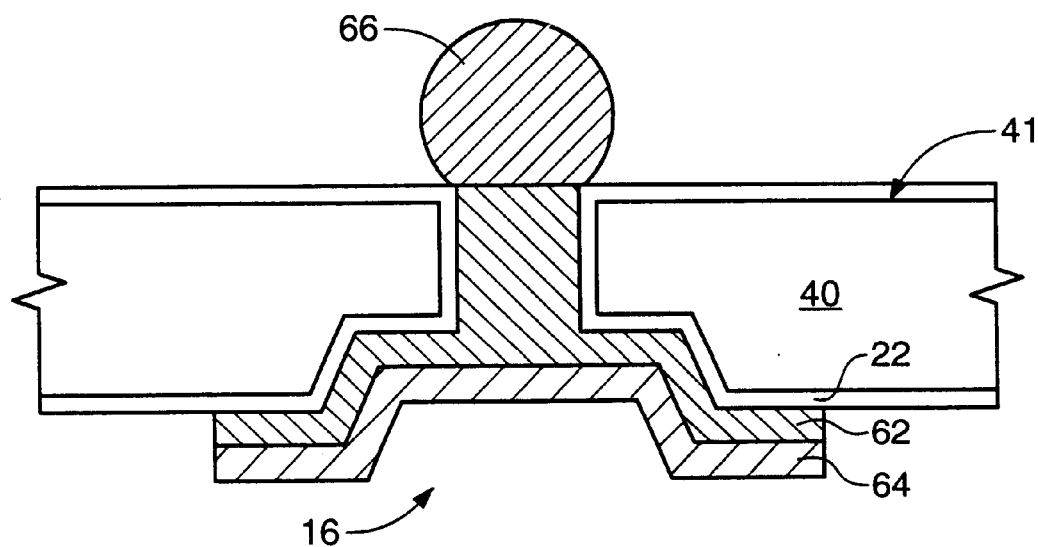

Continuing with FIGS. 27–28, the stencil is removed, leaving stenciled solder 76 over and in contact with via contact 75, the outwardly facing surface of the conductive material 62 at the via's opening. Thereafter, heat is applied to the stenciled solder 76 so as to reflow the solder and form a rounded shape for micro-bump 66. In an exemplary embodiment, the solder comprises a lead/tin eutectic and is heated to a reflow temperature of about 183° C. In an alternative embodiment, the solder comprises a 95:5 lead/tin mixture and is heated to a reflow temperature of about 320° C. During the re-flow, it is theorized that the surface tension and cohesive forces of the molten solder provide the forces operative to reshape the solder into a hemispherical or generally convex shape.

Figure 29:
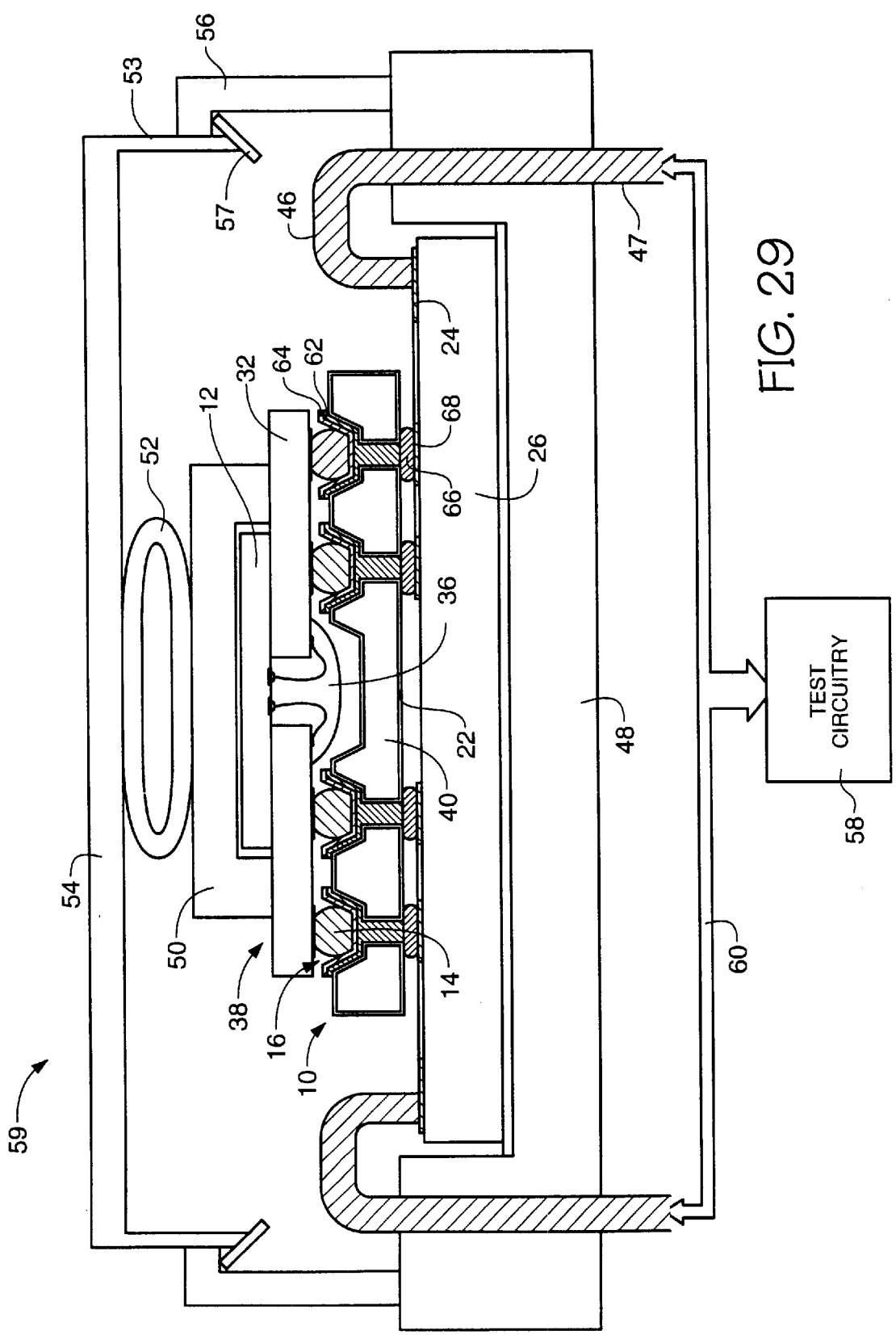
FIG. 29 is a cross-sectional view of a test jig for testing a microelectronic device seated upon and pressed against a test insert.

In a test jig, referencing FIGS. 15 and 29, silicon insert 10 is positioned over support substrate 26 with the micro-bumps 66 over their pads 68 of the support substrate 26. Thereafter, heat is applied to re-flow the solder microbumps 66 for wetting pads 68 of the support substrate and securing silicon insert 10 to support substrate 26. Support substrate 26 and silicon insert 10 can then be employed in a test system, such as that portrayed by FIG. 29, for testing a microelectronic device 38 having an array of outwardly projecting contacts 14.

For the exemplary test system illustrated by FIG. 29, test circuitry 58 sends electrical signals to the device under test by way of bus 60, terminal leads 47, conductive traces 24 of support substrate 26, micro-bumps 66, via 61 and lined pockets 16 of insert 10. As described before relative FIG. 14, cover 54 clips into clamp ring 56 by way of tabs 57 for compressing biasing member 52 to provide a force against force plate 50 which presses outwardly projecting contacts 14 of microelectronic device 38 into pockets 16 of the silicon insert 10.

Thus, the present invention provides a new insert, method for forming an insert and method of testing a globbed chip-scale-packaged microelectronic device. Although the foregoing invention has been described with respect to certain exemplary embodiments, other embodiments will become apparent in view of the disclosure herein. Accordingly, the described embodiments are to be considered only as illustrative and not restrictive. The scope of the invention, therefore, is indicated by the appended claims and their combination in whole or in part rather than by the foregoing description. All changes thereto which come within the meaning and range of the equivalent of the claims are to be embraced within the scope of the claims.

What is claimed is:

1. A system, comprising:
    an integrated circuit package having on a first side conductive contact bumps and a non-conductive protrusion; and
    a socket, the socket comprising a monocrystalline substrate comprising a plurality of pockets in electrical contact with the contact bumps of the package, the substrate also comprising a recess to receive the non-conductive protrusion.

2. The system of claim 1, wherein the substrate further comprises a dielectric material formed over the substrate.

3. The system of claim 2, wherein the substrate further comprises a conductive material formed over the dielectric material and within at least a portion of at least some of the plurality of pockets and in contact with the electrical contact bumps.

4. The system of claim 3, wherein the conductive material comprises at least one of the group consisting of refractory metal, refractory metal nitride, and refractory metal salicide.

5. The system of claim 3, wherein the conductive material comprises at least one of the group consisting of group IIIB through VIIIB metals.

6. The system of claim 3, wherein the conductive material resists bonding to the electrical-contact bumps.

7. The system of claim 2, wherein the dielectric material comprises an oxide.

8. The system of claim 1, wherein the recess has a perimeter encompassing an area greater than any of the pockets.

9. The system of claim 1, wherein the pockets each have a width less than 400 µm and the recess has a width greater than 500 µm.

10. The system of claim 1, wherein the pockets each have a width between 100–400 µm, and the recess has a width between 2,000–3,000 µm and length between 4,000 to 15,000 µm.

11. The system of claim 1, wherein the pockets and the recess have the same depth.

12. The system of claim 1, wherein the depth is at least 10 µm.

13. The system of claim 1, wherein the pockets and the recess have a depth between 15–150 µm.

14. The system of claim 1, wherein the recess is disposed between at least two pockets of the plurality of pockets.

15. The system of claim 1, wherein the monocrystalline substrate comprises silicon.

16. The system of claim 3, wherein the conductive material resists bonding to solder.

17. The system of claim 3, wherein the integrated circuit package is a ball grid array.

18. The system of claim 1, wherein the integrated circuit package is a globbed chip scale package.

19. The system of claim 1, wherein the monocrystalline substrate has a <100> lattice-plane of orientation at a primary surface.

20. The system of claim 1, wherein the pockets have walls that are sloped at an angle of about 40–70 degrees relative a plane defined by the substrate.

21. The system of claim 1, wherein the socket further comprises conductive members in electrical communication with at least one of the plurality of pockets and in further electrical communication with an electrical test apparatus.

22. The system of claim 21, wherein the conductive members are in communication with the electrical test apparatus through a wire bond.

23. The system of claim 1, wherein the socket further comprises conductive vias passing through the substrate and in electrical communication with at least one of the plurality of pockets.

24. The system of claim 23, wherein the vias are in communication with an electrical test apparatus.

* * * * *